United States Patent
Tan et al.

(10) Patent No.: US 10,228,714 B1
(45) Date of Patent: Mar. 12, 2019

(54) LOW DROPOUT SHUNT VOLTAGE REGULATOR WITH WIDE INPUT SUPPLY VOLTAGE RANGE

(71) Applicant: LITE-ON SINGAPORE PTE. LTD., Midview (SG)

(72) Inventors: Meng-Tong Tan, Midview (SG); Huey-Jen Lim, Midview (SG); You-Fa Wang, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 15/990,552

(22) Filed: May 25, 2018

(51) Int. Cl.
G05F 3/26 (2006.01)
G05F 1/46 (2006.01)
H03F 1/02 (2006.01)

(52) U.S. Cl.
CPC .............. *G05F 3/262* (2013.01); *G05F 3/26* (2013.01); *G05F 1/46* (2013.01); *H03F 1/0205* (2013.01)

(58) Field of Classification Search
CPC ..... G05F 1/46–1/656; G05F 3/26–3/30; H03F 1/0205–1/0294
See application file for complete search history.

(56) References Cited

U.S. PATENT DOCUMENTS

| 7,872,519 B2* | 1/2011 | Shibata | G05F 3/262 327/541 |
| 9,594,391 B2* | 3/2017 | de Cremoux | G05F 3/08 |
| 2012/0176107 A1* | 7/2012 | Shrivas | G05F 1/575 323/271 |

* cited by examiner

*Primary Examiner* — Kyle J Moody
*Assistant Examiner* — Peter M Novak
(74) *Attorney, Agent, or Firm* — Li & Cai Intellectual Property (USA) Office

(57) ABSTRACT

A low-dropout shunt voltage regulator is provided, which includes a first current mirror module, a second current mirror module and an output module. A first terminal of the first current mirror module is electrically connected to the input voltage. The first current mirror module has high output resistance. A first terminal of the second current mirror module is electrically connected to a second terminal of the first current mirror module. A second terminal of the second current mirror module is electrically connected to a reference voltage. An output terminal of the output module is electrically connected to the third terminal of the first current mirror module. The output terminal and a first terminal of the output module are both connected to the second current mirror module. A second terminal of the output module is electrically connected to the reference voltage.

9 Claims, 5 Drawing Sheets

LOW DROPOUT SHUNT VOLTAGE REGULATOR WITH WIDE INPUT SUPPLY VOLTAGE RANGE

BACKGROUND OF THE INVENTION

1. Technical Field

The present disclosure relates to a low-dropout shunt voltage regulator, in particular, to a low-dropout shunt voltage regulator having a high output impedance current source.

2. Description of Related Art

The low-dropout linear shunt regulator is a circuit that provides a constant voltage and a constant current in a voltage regulator circuit. In addition, the low-dropout linear regulator can receive a wide range of input voltages, such as 5V to 30V.

However, the range of input voltages is wide and the low-dropout linear regulator needs to provide a stable output current. When an input voltage is a high voltage, the power consumption of a conventional low-dropout linear regulator which commonly employs a current mirror circuit as a current source rises because conventional current mirror switches do not have high output impedance.

Therefore, providing a regulator having a high output impedance current source is an important subject in the industry.

SUMMARY OF THE INVENTION

A low-dropout shunt voltage regulator is provided in the present disclosure, which includes a first current mirror module, a second current mirror module and an output module. A first terminal of the first current mirror module is electrically connected to the input voltage. The first current mirror module has high output resistance. A first terminal of the second current mirror module is electrically connected to a second terminal of the first current mirror module. A second terminal of the second current mirror module is electrically connected to a reference voltage. An output terminal of the output module is electrically connected to a third terminal of the first current mirror module. The output terminal and a first terminal of the output module are both connected to the second current mirror module. A second terminal of the output module is electrically connected to the reference voltage.

According to the above, the low-dropout shunt voltage regulator of the present disclosure uses the combination of the low-voltage first current mirror switch, the low-voltage third current mirror switch, the high-voltage second current mirror switch, and the high-voltage fourth current mirror switch for building up a current mirror that has high output impedance for decreasing the current variation between the range of input voltages. Moreover, the power consumption of the low-dropout shunt voltage regulator can be reduced, accordingly. In addition, the layout of the chip can be more flexible according to the high-voltage switches and the low-voltage switches.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF PREFERRED EMBODIMENTS

Figure 1:
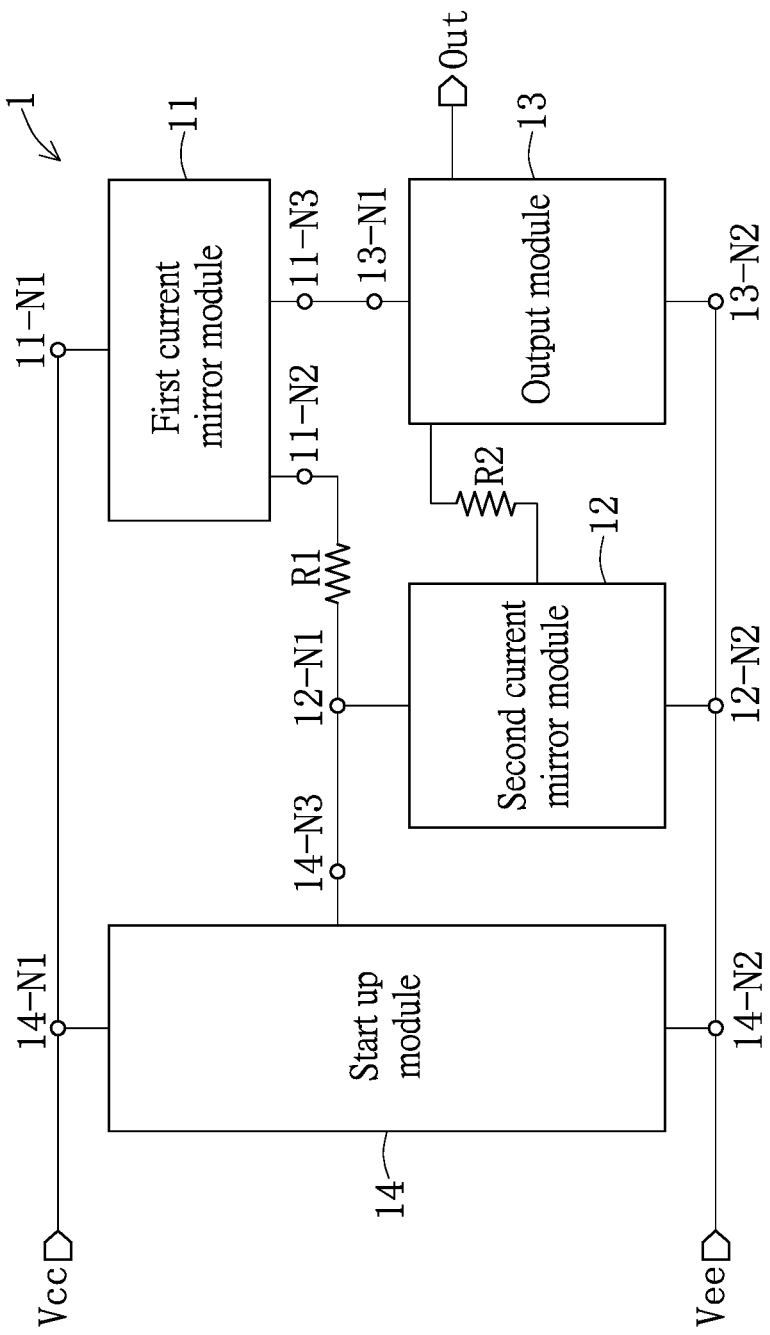
FIG. 1 is a schematic diagram of a low-dropout shunt voltage regulator according to an embodiment of the present disclosure.

Reference is made in detail to the exemplary embodiments of the present disclosure, examples of which are illustrated in the accompanying drawings. Wherever possible, the same reference numbers are used in the drawings and the description to refer to the same or alike parts.

[The Low-Dropout Shunt Voltage Regulator Embodiment]

Figure 2:
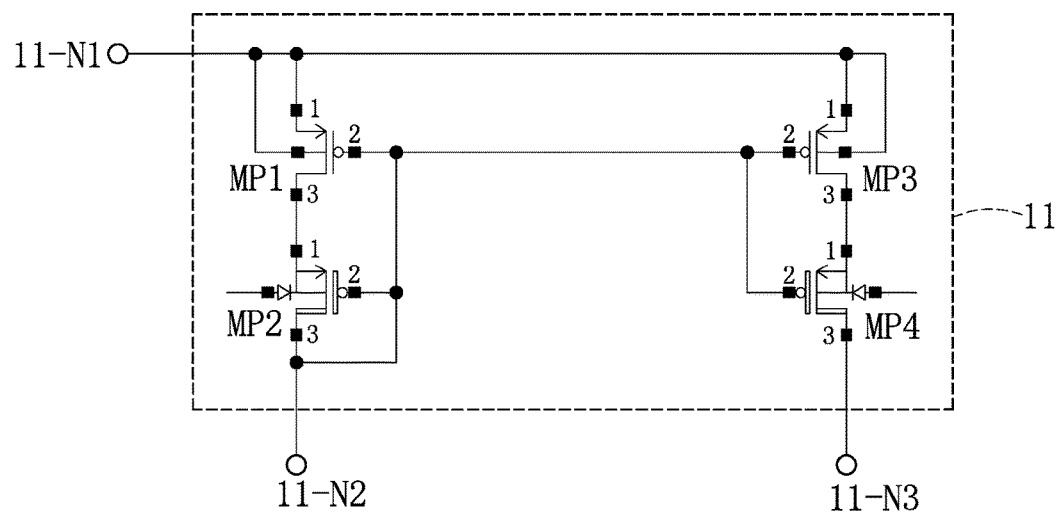
FIG. 2 is a schematic diagram of a first current mirror module in FIG. 1.
Figure 3:
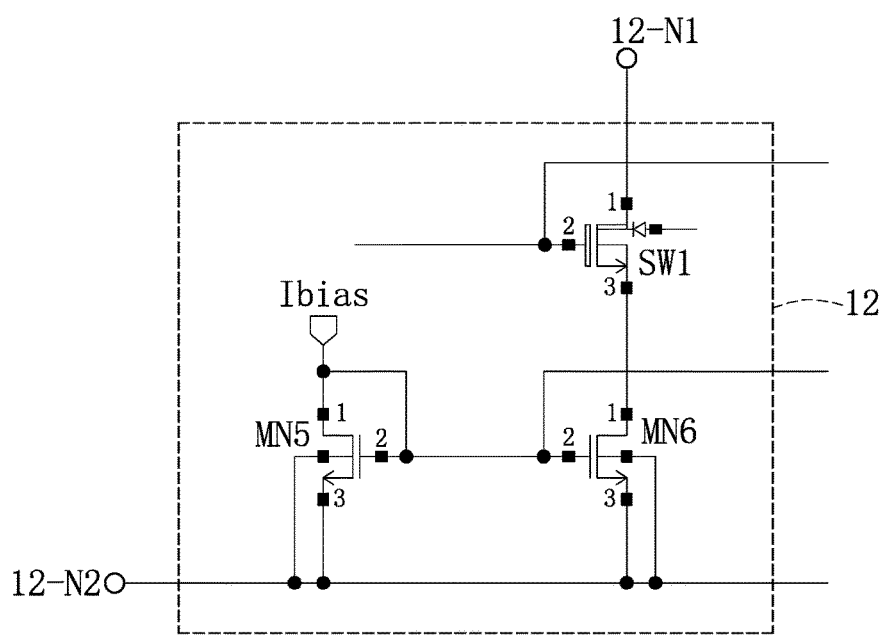
FIG. 3 is a schematic diagram of a second current mirror module in FIG. 1.
Figure 4:
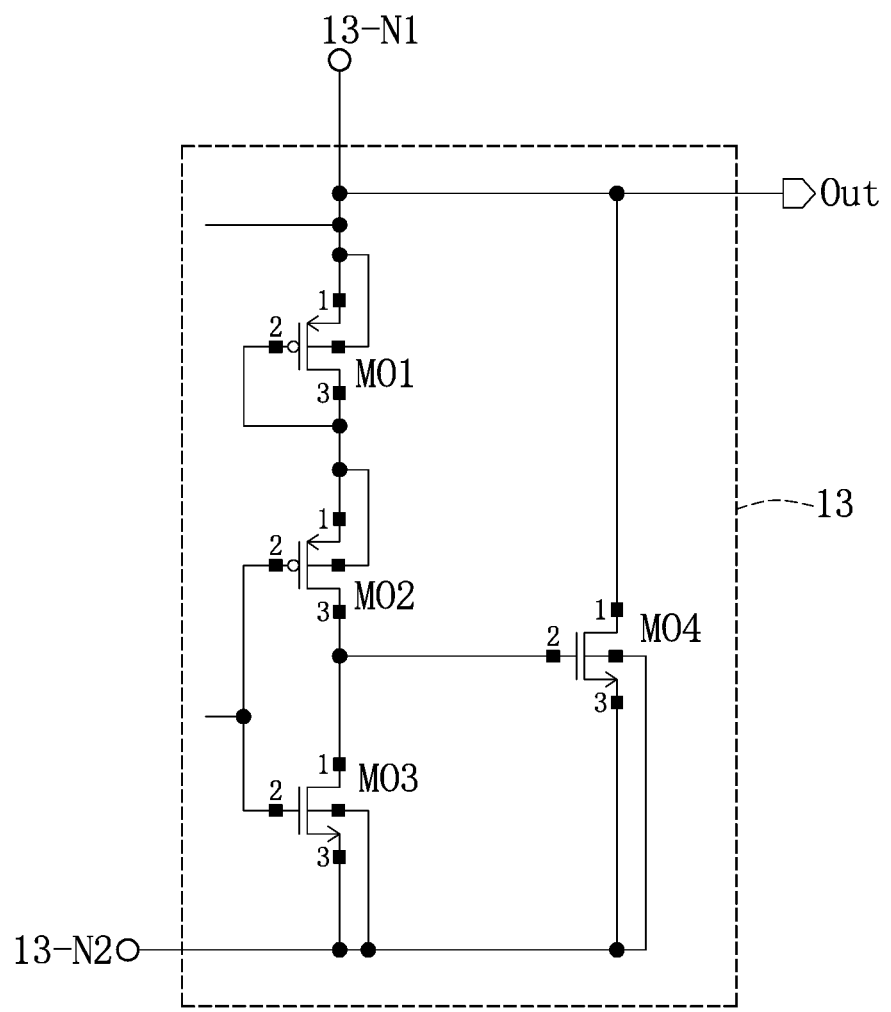
FIG. 4 is a schematic diagram of an output module in FIG. 1.
Figure 5:
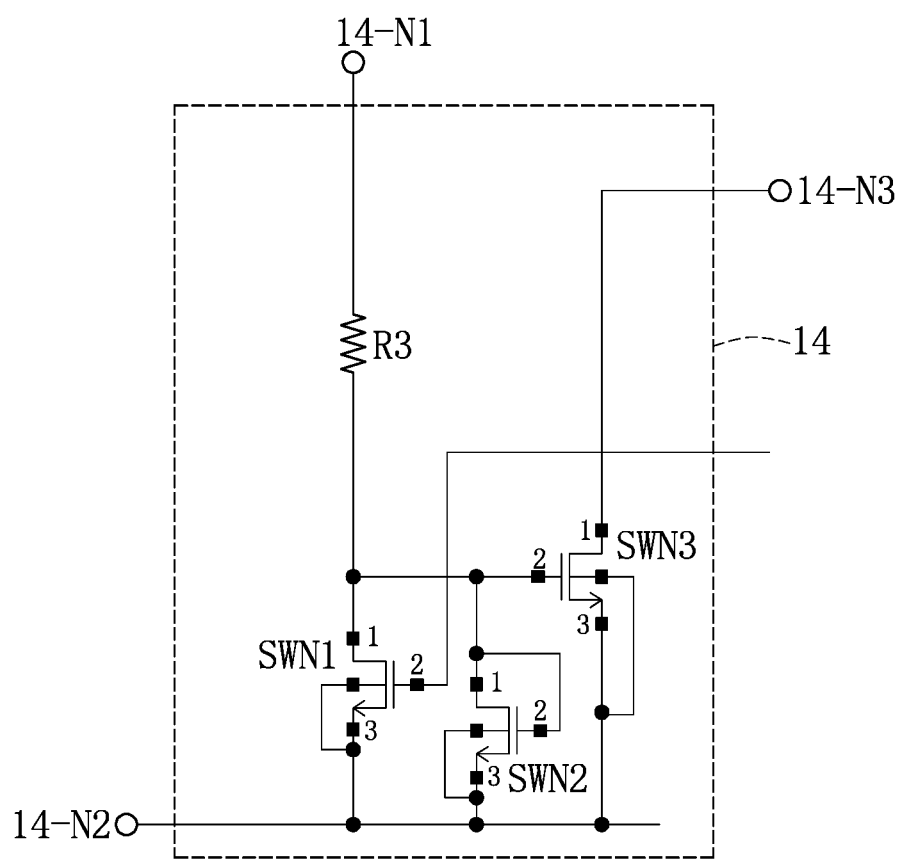
FIG. 5 is a schematic diagram of a start-up module in FIG. 1.

Referring to FIGS. 1-5, FIG. 1 is a schematic diagram of a low-dropout shunt voltage regulator according to an embodiment of the present disclosure, FIG. 2 is a schematic diagram of a first current mirror module in FIG. 1, FIG. 3 is a schematic diagram of a second current mirror module in FIG. 1, FIG. 4 is a schematic diagram of an output module in FIG. 1, and FIG. 5 is a schematic diagram of a start-up module in FIG. 1.

A low-dropout shunt voltage regulator 1 includes a first current mirror module 11, a second current mirror module 12, an output module 13 and a start-up module 14.

In the embodiment, the low-dropout shunt voltage regulator 1 is a low-dropout linear shunt regulator used for transferring an input voltage Vcc into an output voltage Vout. In the embodiment, the range of the input voltage Vcc is between 0V~40V, and in other embodiments, the range of the input voltage is between 4.5V~30V; however, the input voltage range can be adjusted according to practical requirements, and the present disclosure is not limited thereto.

In the embodiment, the first current mirror module 11 includes a first terminal 11-N1, a second terminal 11-N2, and a third terminal 11_N3. The first terminal 11-N1 is electrically connected to the input voltage Vcc.

The second current mirror module 12 includes a first terminal 12-N1 and a second terminal 12-N2. The first terminal 12-N1 is electrically connected to the second terminal 11-N2 of the first current mirror module 11. The second terminal 12-N2 of the second current mirror module 12 is electrically connected to a reference voltage Vee. In the embodiment, the reference voltage is a grounding voltage which can be adjusted according to practical requirements, but the present disclosure is not limited thereto.

The output module 13 includes an output terminal Out, a first terminal 13-N1, and a second terminal 13-N2. The output terminal Out of the output module 13 is electrically connected to the third terminal 11-N3 of the first current mirror module 11. The output terminal Out and the first terminal 13-N1 of the output module 13 are both connected to the second current mirror module 12. The second terminal 13-N2 of the output module 13 is electrically connected to the reference voltage Vee. The low-dropout shunt voltage regulator 1 provides the output voltage Vout through the output terminal Out of the output module 13. The output voltage Vout is a fixed voltage or a variable voltage which can be adjusted according to practical requirements, but the present disclosure is not limited thereto.

The start-up module 14 includes a first terminal 14-N1, a second terminal 14-N2 and a third terminal 14-N3. The first terminal 14-N1 of the start-up module 14 is electrically connected to the input voltage Vcc. The second terminal 14-N2 of the start-up module 14 is electrically connected to the reference voltage Vee. The third terminal 14-N3 of the start-up module 14 is electrically connected to the first terminal 12-N1 of the second current mirror module 12.

The third terminal 14-N3 of the start-up module 14 is electrically connected to the second terminal 11-N2 of the first current mirror module 11 through a first resistor R1. The output terminal Out of the output module 13 is electrically connected to the second current mirror module 12 through a second resistor R2.

Referring to FIG. 2, the first current mirror module 11 includes a first current mirror switch MP1, a second current mirror switch MP2, a third current mirror switch MP3, and a fourth current mirror switch MP4.

The first current mirror switch MP1 includes a first terminal, a second terminal, and a third terminal. The first terminal of the first current mirror switch MP1 is electrically connected to the first terminal 11-N1 of the first current mirror module 11. The second current mirror switch MP2 includes a first terminal, a second terminal, and a third terminal. The first terminal of the second current mirror switch MP2 is electrically connected to the third terminal of the first current mirror switch MP1. The second terminal of the second current mirror switch MP2 is electrically connected to the second terminal of the first current mirror switch MP1 and the third terminal of the second current mirror switch MP2.

The third terminal of the second current mirror switch MP2 is electrically connected to the second terminal 11-N2 of the first current mirror module 11. The third current mirror switch MP3 includes a first terminal, a second terminal, and a third terminal. The first terminal of the third current mirror switch MP3 is electrically connected to the first terminal 11-N1 of the first current mirror module 11. The second terminal of the third current mirror switch MP3 is electrically connected to the second terminal of the first current mirror switch MP1 and the second terminal of the second current mirror switch MP2. The fourth current mirror switch MP4 includes a first terminal, a second terminal, and a third terminal. The first terminal of the fourth current mirror switch MP4 is electrically connected to the third terminal of the third current mirror switch MP3. The second terminal of the fourth current mirror switch MP4 is electrically connected to the second terminal of the third current mirror switch MP3. The third terminal of the fourth current mirror switch MP4 is electrically connected to the third terminal 11-N3 of the first current mirror module 11.

In the embodiment, the first current mirror switch MP1, the second current mirror switch MP2, the third current mirror switch MP3 and the fourth current mirror switch MP4 are constructed as a current mirror circuit to receive the input voltage Vcc for providing a stable current to the output terminal Out.

In the embodiment, the first current mirror switch MP1, the second current mirror switch MP2, the third current mirror switch MP3 and the fourth current mirror switch MP4 are P-type Metal Oxide Semiconductor Field Effect Transistors (P-type MOSFET). In the embodiment, the first current mirror switch MP1 and the third current mirror switch MP3 are Low-voltage MOSFETs, and the second current mirror switch MP2 and the fourth current mirror switch MP4 are High-voltage MOSFETs. In addition, the first current mirror switch MP1 and the second current mirror switch MP2 can be designed as a composite transistor. Similarly, the third current mirror switch MP3 and the fourth current mirror switch MP4 can also be designed as a composite transistor, but the present disclosure is not limited thereto.

In the embodiment, the first current module 11 has a high output impedance according to the combination of the Low-voltage first current mirror switch MP1, the Low-voltage third current mirror switch MP3, the High-voltage second current mirror switch MP2, and the High-voltage fourth current mirror switch MP4. Therefore, the output current variation of the first current mirror module 11 that is from the low input voltage to the high input voltage can be decreased, in which the input voltage range is between 4.5 V and 30V.

Referring to FIG. 3, the second current mirror module 12 includes a first switch SW1, a fifth current mirror switch MN5, and a sixth current mirror switch MN6. The first switch SW1 includes a first terminal, a second terminal, and a third terminal. The first terminal of the first switch SW1 is electrically connected to the first terminal 12-N1 of the second current mirror module 12. The fifth current mirror switch MN5 includes a first terminal, a second terminal, and a third terminal. The first terminal of the fifth current mirror switch MN5 is electrically connected to an external current source Ibias and the second terminal of the fifth current mirror switch MN5. The third terminal of the fifth current mirror switch MN5 is electrically connected to the reference voltage Vee.

The sixth current mirror switch MN6 includes a first terminal, a second terminal, and a third terminal. The first terminal of the sixth current mirror switch MN6 is electrically connected to the third terminal of the first switch SW1. The second terminal fo the sixth current mirror switch MN6 is electrically connected to the second terminal of the fifth current mirror switch MN5. The third terminal of the sixth current mirror switch MN6 is electrically connected to the reference voltage Vee.

In the embodiment, the fifth current mirror switch MN5 and the sixth current mirror switch MN6 are constructed as a current mirror circuit.

Referring to FIG. 4, the output module 13 includes a first output switch MO1, a second output switch MO2, a third output switch MO3, and a fourth output switch MO4.

The first output switch MO1 includes a first terminal, a second terminal, and a third terminal. The first terminal of the first output switch MO1 is electrically connected to the output terminal Out of the output module 13. The second terminal of the first output switch MO1 is electrically connected to the third terminal of the first output switch MO1.

The second output switch MO2 includes a first terminal, a second terminal, and a third terminal. The first terminal of the second output switch MO2 is electrically connected to the third terminal of the first output switch MO1.

The third output switch MO3 includes a first terminal, a second terminal, and a third terminal. The first terminal of the third output switch MO3 is electrically connected to the third terminal of the second output switch MO2. The second terminal of the third output switch MO3 is electrically connected to the second terminal of the second output switch MO2. The third terminal of the third output switch MO3 is electrically connected to the reference voltage Vee.

The fourth output switch MO4 includes a first terminal, a second terminal, and a third terminal. The first terminal of the fourth output switch MO4 is electrically connected to the output terminal Out of the output module 13. The second terminal of the fourth output switch MO4 is electrically connected to the third terminal of the second output switch MO2 and the first terminal of the third output switch MO3. The third terminal of the fourth output switch MO4 is electrically connected to the reference Vee. The second terminal of the second output switch MO2 and the second terminal of the third output switch MO3 are electrically connected to the second terminal of the fifth current mirror switch MN5 of the second current mirror module 12 and the second terminal of the sixth current mirror switch MN6.

In addition, the output terminal Out is electrically connected to the second terminal of the first switch SW1 of the second current mirror module 12 through the second resistor R2. In other words, the output voltage Vout of the output terminal Out is used as a bias voltage of the first switch SW1 for ensuring the turn-on state of the first switch SW1 at an extreme low input voltage Vcc.

In the embodiment, the first output switch MO1 and the second output switch MO2 of the output module 13 and the fifth current mirror switch MN5 of the second current mirror module 12 are used for building up the output voltage Vout.

The second output switch MO2 and the third output switch MO3 are constructed as a AB-class amplifier for controlling the turn-on/turn-off state of the fourth output switch MO4 to adjust the output voltage Vout of the output terminal Out.

Referring to FIG. 5, the start-up module 14 include a first start-up SWN1, a diode connected transistor SWN2, and a second start-up switch SWN3.

The first start-up switch SWN1 includes a first terminal, a second terminal, and a third terminal.

The first terminal of the first start-up switch SWN1 is electrically connected to the first terminal 14-N1 of the start-up module 14 through a third resistor R3. The second terminal of the first start-up switch SWN1 is electrically connected to the second terminal of the first switch SW1 of the second current mirror module 12. The third terminal of the first start-up switch SWN1 is electrically connected to the second terminal 14-N2 of the start-up module 14.

The diode connected transistor SWN2 includes a first terminal, a second terminal, and a third terminal.

The first terminal of the diode connected transistor SWN2 is electrically connected to the first terminal of the first start-up switch SWN1 and the second terminal of the diode connected transistor SWN2. The third terminal of the diode connected transistor SWN2 is electrically connected to the second terminal 14-N2 of the start-up module 14.

The third start-up switch SWN3 includes a first terminal, a second terminal, and a third terminal.

The first terminal of the third start-up switch SWN3 is electrically connected to the third terminal 14-N3 of the start-up module 14. The second terminal of the third start-up switch SWN3 is electrically connected to the first terminal of the first start-up switch SWN1 and the first terminal of the diode connected transistor SWN2. The third terminal of the third start-up switch SWN3 is electrically connected to the second terminal 14-N2 of the start-up module 14. In the embodiment, the first terminal of the third start-up switch SWN3 is electrically connected to the second terminal 11-N2 of the first current mirror module 11 through the first resistor R1.

In the embodiment, the first start-up switch SWN1, the diode connected transistor SWN2, and the third start-up switch SWN3 are used for starting up the low-drop voltage regulator 1. In other embodiments, other circuits can be used for starting up the low-dropout shunt voltage regulator 1, but the present disclosure is not limited thereto.

Figure 6:
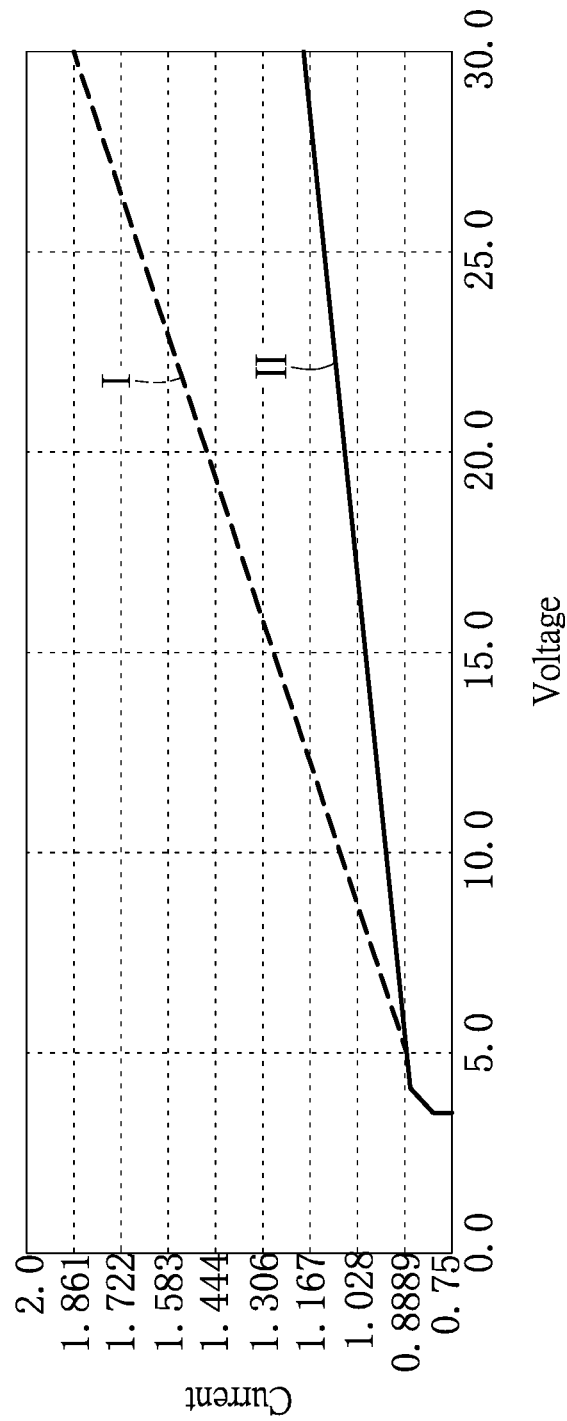
FIG. 6 is a schematic diagram of an I-V curve of the first current mirror module in FIG. 1.

Referring to FIG. 6, FIG. 6 is a schematic diagram of an I-V curve of the first current mirror module in FIG. 1.

The dotted line is an I-V curve of a conventional low-dropout shunt voltage regulator having an one-stage current mirror module in the prior art, and the input voltage is between the rated range.

The solid line II is an I-V curve of the low-dropout shunt voltage regulator disposed with the first current mirror module that has high output impedance provided in the present disclosure, and the input voltage is between the rated range. According to the two lines it can be found that the first current mirror module 11 of the low-dropout shunt voltage regulator 1 that has a high output impedance current source provided in the present disclosure has a current variation that is smaller than the current variation of an one-stage current mirror module of a conventional low-dropout shunt voltage regulator employed in the prior art.

According to the above, the low-dropout shunt voltage regulator of the present disclosure uses the combination of the low-voltage first current mirror switch, the low-voltage third current mirror switch, the high-voltage second current mirror switch, and the high-voltage fourth current mirror switch for building up a current mirror that has high output impedance for decreasing the current variation between the range of input voltages. Moreover, the power consumption of the low-dropout shunt voltage regulator can be reduced, accordingly. In addition, the layout of the chip can be more flexible according to the high-voltage switches and the low-voltage switches.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A low-dropout shunt voltage regulator for converting an input voltage to an output voltage, the low-dropout shunt voltage regulator comprising:
a first current mirror module including a first terminal, a second terminal, and a third terminal, wherein the first terminal of the first current mirror module is electrically connected to the input voltage, the first current mirror module has high output impedance;
a second current mirror module including a first terminal and a second terminal, wherein the first terminal of the second current mirror module is electrically connected to the second terminal of the first current mirror module, the second terminal of the second current mirror module is electrically connected to a reference voltage; and an output module including an output terminal, a first terminal, and a second terminal, wherein the output terminal of the output module is electrically connected to the third terminal of the first current mirror module, the output terminal and the first terminal of the output module are both connected to the second current mirror module, and the second terminal of the output module is electrically connected to the reference voltage; and a start-up module including a first terminal, a second terminal, and a third terminal, wherein the first terminal of the start-up module is electrically connected to the input voltage, the second terminal of the start-up module is electrically connected to the reference voltage, and the third terminal of the start-up module is electrically connected to the first terminal of the second current mirror module, wherein the first current mirror module further includes:
a first current mirror switch including a first terminal, a second terminal, and a third terminal, wherein the first terminal of the first current mirror switch is electrically connected to the first terminal of the first current mirror module;

a second current mirror switch including a first terminal, a second terminal, and a third terminal, wherein the first terminal of the second current mirror switch is electrically connected to the third terminal of the first current mirror switch, the second terminal of the second current mirror switch is electrically connected to the second terminal of the first current mirror switch and the third terminal of the second current mirror switch, and the third terminal of the second current mirror switch is electrically connected to the second terminal of the first current mirror module;

a third current mirror switch including a first terminal, a second terminal, and a third terminal, wherein the first terminal of the third current mirror switch is electrically connected to the first terminal of the first current mirror module, the second terminal of the third current mirror switch is electrically connected to the second terminal of the first current mirror switch and the second terminal of the second current mirror switch; and a fourth current mirror switch including a first terminal, a second terminal, and a third terminal, wherein the first terminal of the fourth current mirror switch is electrically connected to the third terminal of the third current mirror switch, the second terminal of the fourth current mirror switch is electrically connected to the second terminal of the third current mirror switch, and the third terminal of the fourth current mirror switch is electrically connected to the third terminal of the first current mirror module.

2. The low-dropout shunt voltage regulator of claim 1, wherein the third terminal of the start-up module is electrically connected to the second terminal of the first current mirror module through a first resistor.

3. The low-dropout shunt voltage regulator of claim 1, wherein the output terminal of the output module is electrically connected to the first terminal of the second current mirror module through a second resistor.

4. The low-dropout shunt voltage regulator of claim 1, wherein the second current mirror module comprises:
a first switch including a first terminal, a second terminal, and a third terminal, wherein the first terminal of the first switch is electrically connected to the first terminal of the second current mirror module;

a fifth current mirror switch including a first terminal, a second terminal, and a third terminal, wherein the first terminal of the fifth current mirror switch is electrically connected to an external current source and the second terminal of the fifth current mirror switch, and the third terminal of the fifth current mirror switch is electrically connected to the reference voltage; and a sixth current mirror switch including a first terminal, a second terminal, and a third terminal, wherein the first terminal of the sixth current mirror switch is electrically connected to the third terminal of the first switch, the second terminal of the sixth current mirror switch is electrically connected to the second terminal of the fifth current mirror switch, and the third terminal of the sixth current mirror switch is electrically connected to the reference voltage.

5. The low-dropout shunt voltage regulator of claim 4, wherein the output module comprises:
a first output switch including a first terminal, a second terminal, and a third terminal, wherein the first terminal of the first output switch is electrically connected to the output terminal of the output module, and the second terminal of the first output switch is electrically connected to the third terminal of the first output switch;

a second output switch including a first terminal, a second terminal, and a third terminal, wherein the first terminal of the second output switch is electrically connected to the third terminal of the first output switch;

a third output switch including a first terminal, a second terminal, and a third terminal, wherein the first terminal of the third output switch is electrically connected to the third terminal of the second output switch, the second terminal of the third output switch is electrically connected to the second terminal of the second output switch, and the third terminal of the third output switch is electrically connected to the reference voltage; and a fourth output switch including a first terminal, a second terminal, and a third terminal, wherein the first terminal of the fourth output switch is electrically connected to the output terminal of the output module, the second terminal of the fourth output switch is electrically connected to the third terminal of the second output switch and the first terminal of the third output switch, and the third terminal of the fourth output switch is electrically connected to the reference voltage.

6. The low-dropout shunt voltage regulator of claim 5, wherein the second terminal of the second output switch and the second terminal of the third output switch are electrically connected to the second terminal of the fifth current mirror switch of the second current mirror module and the second terminal of the sixth current mirror switch.

7. The low-dropout shunt voltage regulator of claim 6, wherein the output terminal is electrically connected to the second terminal of the first switch of the second current mirror module through a second resistor.

8. The low-dropout shunt voltage regulator of claim 7, wherein the start-up module comprises:
a first start-up switch including a first terminal, a second terminal, and a third terminal, wherein the first terminal of the first start-up switch is electrically connected to the first terminal of the start-up module through a third resistor, the second terminal of the first start-up switch is electrically connected to the second terminal of the first switch of the second current mirror module, and the third terminal of the first start-up switch is electrically connected to the second terminal of the start-up module;

a diode connected transistor including a first terminal, a second terminal, and a third terminal, wherein the first terminal of the diode connected transistor is electrically connected to the first terminal of the first start-up switch and the second terminal of the diode connected transistor, and the third terminal of the diode connected transistor is electrically connected to the second terminal of the start-up module; and a third start-up switch including a first terminal, a second terminal, and a third terminal, wherein the first terminal of the third start-up switch is electrically connected to the third terminal of the start-up module, the second terminal of the third start-up switch is electrically connected to the first terminal of the first start-up switch and the first terminal of the diode connected transistor, and the third terminal of the third start-up switch is electrically connected to the second terminal of the start-up module.

9. The low-dropout shunt voltage regulator of claim 1, wherein the first current mirror switch and the third current mirror switch are low-voltage P-type metal oxide semiconductor field-effect transistors, and the second current mirror switch and the fourth current mirror switch are high-voltage P-type metal oxide semiconductor field-effect transistors.

* * * * *